United States Patent
Chen

(10) Patent No.: US 11,656,123 B2
(45) Date of Patent: May 23, 2023

(54) SENSOR

(71) Applicant: ANPEC ELECTRONICS CORPORATION, Hsinchu (TW)

(72) Inventor: Chih-Ning Chen, Taipei (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 17/476,436

(22) Filed: Sep. 15, 2021

(65) Prior Publication Data
US 2023/0009395 A1    Jan. 12, 2023

(30) Foreign Application Priority Data
Jul. 12, 2021  (TW) .................................. 110125422

(51) Int. Cl.
*G01J 1/44* (2006.01)
*H03F 3/45* (2006.01)

(52) U.S. Cl.
CPC ............ *G01J 1/44* (2013.01); *H03F 3/45475* (2013.01); *G01J 2001/446* (2013.01)

(58) Field of Classification Search
CPC .... G01J 1/44; G01J 2001/446; H03F 3/45475
See application file for complete search history.

(56) References Cited

U.S. PATENT DOCUMENTS

2021/0218393 A1*  7/2021  Lenhard ............... H03K 17/162

* cited by examiner

*Primary Examiner* — Thanh Luu
(74) *Attorney, Agent, or Firm* — Li & Cai Intellectual Property Office

(57) ABSTRACT

A sensor is provided. A first terminal of a first current source and a first terminal of a first transistor are connected to a cathode of the photodiode. A control terminal of a second transistor is connected to an output terminal of a first operational amplifier. A first terminal of the second transistor is connected to a second terminal of the first transistor through a first current mirror circuit. A second terminal of the second transistor is connected to a second current source, a second input terminal of a second operational amplifier and a first terminal of a third transistor. A first input terminal of the second operational amplifier is connected to the first terminal of the first transistor. A control terminal of the third transistor is connected to an output terminal of the second operational amplifier.

5 Claims, 13 Drawing Sheets

SENSOR

CROSS-REFERENCE TO RELATED PATENT APPLICATION

This application claims the benefit of priority to Taiwan Patent Application No. 110125422, filed on Jul. 12, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a sensor, and more particularly to a sensor that includes a photodiode.

BACKGROUND OF THE DISCLOSURE

A cell phone having a touch screen is becoming more and more popular. When a user makes a call, a face of the user may easily touch the touch screen of the cell phone which inadvertently triggers the cell phone to perform an operation. Therefore, an optical proximity sensor is often installed in the cell phone. When the optical proximity sensor detects that light is blocked, a system of the cell phone determines that the face is too close to the touch screen and accordingly turns off the touch screen, thereby preventing the cell phone from being triggered unexpectedly by being touched with the face, and a power of the cell phone can be saved during the call.

Such a mechanism firstly involves the transmitter emitting a light signal toward a user. Then, the light signal is reflected to a photodiode by the user and the photodiode converts the reflected light signal into a photocurrent. However, a parasitic capacitor exists in the photodiode. The photocurrent first charges the parasitic capacitor of the photodiode for a period of time. As a result, after the light signal is no longer reflected to the photodiode and passes through the photodiode, a voltage of a cathode of the photodiode is affected by a high voltage of the charged parasitic capacitor. The voltage of the cathode of the photodiode cannot be maintained at a desired voltage value, such that a value of the photocurrent of the photodiode that is not irradiated by the light signal cannot be correctly sensed.

SUMMARY OF THE DISCLOSURE

In response to the above-referenced technical inadequacies, the present disclosure provides a sensor. The sensor includes a photodiode, a first operational amplifier, a first current source, a first transistor, a first current mirror circuit, a second transistor, a second current source, a second operational amplifier and a third transistor. An anode of the photodiode is grounded. A first input terminal of the first operational amplifier is coupled to a reference voltage. A second input terminal of the first operational amplifier is connected to a cathode of the photodiode. A first terminal of the first current source is connected to the cathode of the photodiode. A second terminal of the first current source is grounded. A control terminal of the first transistor is connected to an output terminal of the first operational amplifier. A first terminal of the first transistor is connected to the cathode of the photodiode. An input terminal of the first current mirror circuit is connected to a second terminal of the first transistor. A control terminal of the second transistor is connected to the output terminal of the first operational amplifier. A first terminal of the second transistor is connected to an output terminal of the first current mirror circuit. A first terminal of the second current source is connected to a second terminal of the second transistor. A second terminal of the second current source is grounded. A first input terminal of the second operational amplifier is connected to a node between the first terminal of the first transistor and the cathode of the photodiode. A second input terminal of the second operational amplifier is connected to a node between the second terminal of the second transistor and the first terminal of the second current source. A control terminal of the third transistor is connected to an output terminal of the second operational amplifier. A first terminal of the third transistor is connected to the second terminal of the second transistor. A second terminal of the third transistor is grounded. A current flowing through the first terminal of the third transistor is a current sensed by the sensor.

In certain embodiments, the sensor further includes a fourth transistor. A control terminal of the fourth transistor is connected to the output terminal of the second operational amplifier. A first terminal of the fourth transistor is coupled to a common voltage. A second terminal of the fourth transistor is grounded.

In certain embodiments, the sensor further includes a fifth transistor. A control terminal of the fifth transistor is connected to the output terminal of the first operational amplifier. A first terminal of the fifth transistor is connected to the first terminal of the fourth transistor. A second terminal of the fifth transistor is coupled to the common voltage.

In certain embodiments, the sensor further includes a second current mirror circuit. An input terminal of the second current mirror circuit is connected to the second terminal of the fifth transistor. A current of an output terminal of the second current mirror circuit is a current sensed by the sensor.

In certain embodiments, the first current mirror circuit includes a sixth transistor and a seventh transistor. A first terminal of the sixth transistor is coupled to the common voltage. A second terminal of the sixth transistor is connected to the second terminal of the first transistor. A first terminal of the seventh transistor is coupled to the common voltage. A second terminal of the seventh transistor is connected to the first terminal of the second transistor. A control terminal of the seventh transistor is connected to a control terminal of the sixth transistor.

In certain embodiments, the first current mirror circuit further includes an eighth transistor. A control terminal of the eighth transistor is connected to the second terminal of the first transistor. A first terminal of the eighth transistor is connected to the control terminal of the sixth transistor. A second terminal of the eighth transistor is grounded.

In certain embodiments, the first current mirror circuit further includes a ninth transistor. A first terminal of the ninth transistor is coupled to the common voltage. A second terminal of the ninth transistor is connected to the control terminal of the sixth transistor. A control terminal of the ninth transistor is coupled to a first control voltage.

In certain embodiments, the second current mirror circuit includes a tenth transistor and an eleventh transistor. A first terminal of the tenth transistor is coupled to the common voltage, and a second terminal of the tenth transistor is connected to the second terminal of the fifth transistor. A control terminal of the eleventh transistor is connected to a control terminal of the tenth transistor. A first terminal of the eleventh transistor is coupled to the common voltage. A second terminal of the eleventh transistor is an output terminal of the sensor.

In certain embodiments, the second current mirror circuit further includes a twelfth transistor. A control terminal of the twelfth transistor is connected to the second terminal of the fifth transistor. A first terminal of the twelfth transistor is connected to the control terminal of the tenth transistor. A second terminal of the twelfth transistor is grounded.

In certain embodiments, the second current mirror circuit further includes a thirteenth transistor. A first terminal of the thirteenth transistor is coupled to the common voltage. A second terminal of the thirteenth transistor is connected to the control terminal of the tenth transistor. A control terminal of the thirteenth transistor is coupled to a second control voltage.

In certain embodiments, the sensor further includes a third current source. The third current source is connected to the second terminal of the eleventh transistor.

In certain embodiments, the sensor further includes a first capacitor. A first terminal of the first capacitor is connected to the output terminal of the first operational amplifier. A second terminal of the first capacitor is connected to the cathode of the photodiode.

In certain embodiments, the sensor further includes a second capacitor. A first terminal of the second capacitor is connected to the output terminal of the second operational amplifier. A second terminal of the second capacitor is grounded.

In addition, the present disclosure provides a sensor. The sensor includes a photodiode, a first operational amplifier, a first current source, a first transistor, a second transistor, a current mirror circuit, and a pre-charge capacitor. An anode of the photodiode is grounded, and the photodiode is configured to convert energy of light passing through the photodiode into a photocurrent. A first input terminal of the first operational amplifier is coupled to a reference voltage. A second input terminal of the first operational amplifier is connected to a cathode of the photodiode. A first terminal of the first current source is connected to the cathode of the photodiode and a second terminal of the first current source is grounded. A control terminal of the first transistor is connected to an output terminal of the first operational amplifier. A first terminal of the first transistor is connected to the cathode of the photodiode. A control terminal of the second transistor is connected to the output terminal of the first operational amplifier. A current mirror circuit includes a third transistor, a fourth transistor and a fifth transistor. A first terminal of the third transistor, a first terminal of the fourth transistor and a first terminal of the fifth transistor are coupled to the common voltage. A second terminal of the third transistor is connected to a second terminal of the first transistor and a control terminal of the third transistor. A control terminal of the fourth transistor is connected to the control terminal of the third transistor, a second terminal of the fourth transistor and a control terminal of the fifth transistor. A second terminal of the fifth transistor is connected to a first terminal of the second transistor. A first terminal of the pre-charge capacitor is coupled to a common voltage. A second terminal of the pre-charge capacitor is connected to the control terminal of the third transistor. The first current source supplies a current to the pre-charge capacitor to charge the pre-charge capacitor such that a voltage of the pre-charge capacitor increases to a target voltage value. The current is stored in the control terminal of the third transistor. Then, the light passes through the photodiode. The current is discharged from the third transistor through the first current source to a ground. A current flowing through a second terminal of the second transistor is a current sensed by the sensor.

In certain embodiments, the sensor further includes a second current source. A first terminal of the second current source is connected to the second terminal of the second transistor, and a second terminal of the second current source is grounded.

In certain embodiments, the sensor further includes a first switch component. A first terminal of the first switch component is connected to the control terminal of the third transistor. A second terminal of the first switch component is connected to the second terminal of the first transistor and the control terminal of the fourth transistor.

In certain embodiments, the sensor further includes a second switch component. A first terminal of the second switch component is connected to the second terminal of the first transistor and the second terminal of the first switch component. A second terminal of the second switch component is connected to the second terminal of the fourth transistor.

In certain embodiments, the sensor further includes a first capacitor. A first terminal of the first capacitor is connected to the output terminal of the first operational amplifier. A second terminal of the first capacitor is connected to the cathode of the photodiode.

As described above, the present disclosure provides the sensor in which the current source is disposed and connected to the cathode of the photodiode such that a discharging path of the parasitic capacitor of the photodiode is formed. As a result, after the light stops passing through the photodiode, the parasitic capacitor does not have a residual voltage and the voltage of the cathode of the photodiode is not affected by the voltage of the parasitic capacitor. Therefore, the photodiode can operate normally. It is worth noting that, the sensor of the present disclosure includes the bias circuit of the photodiode such that the current sensed by the sensor only includes the photocurrent that is converted from the light signal by the photodiode, but not the current provided by the current source.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
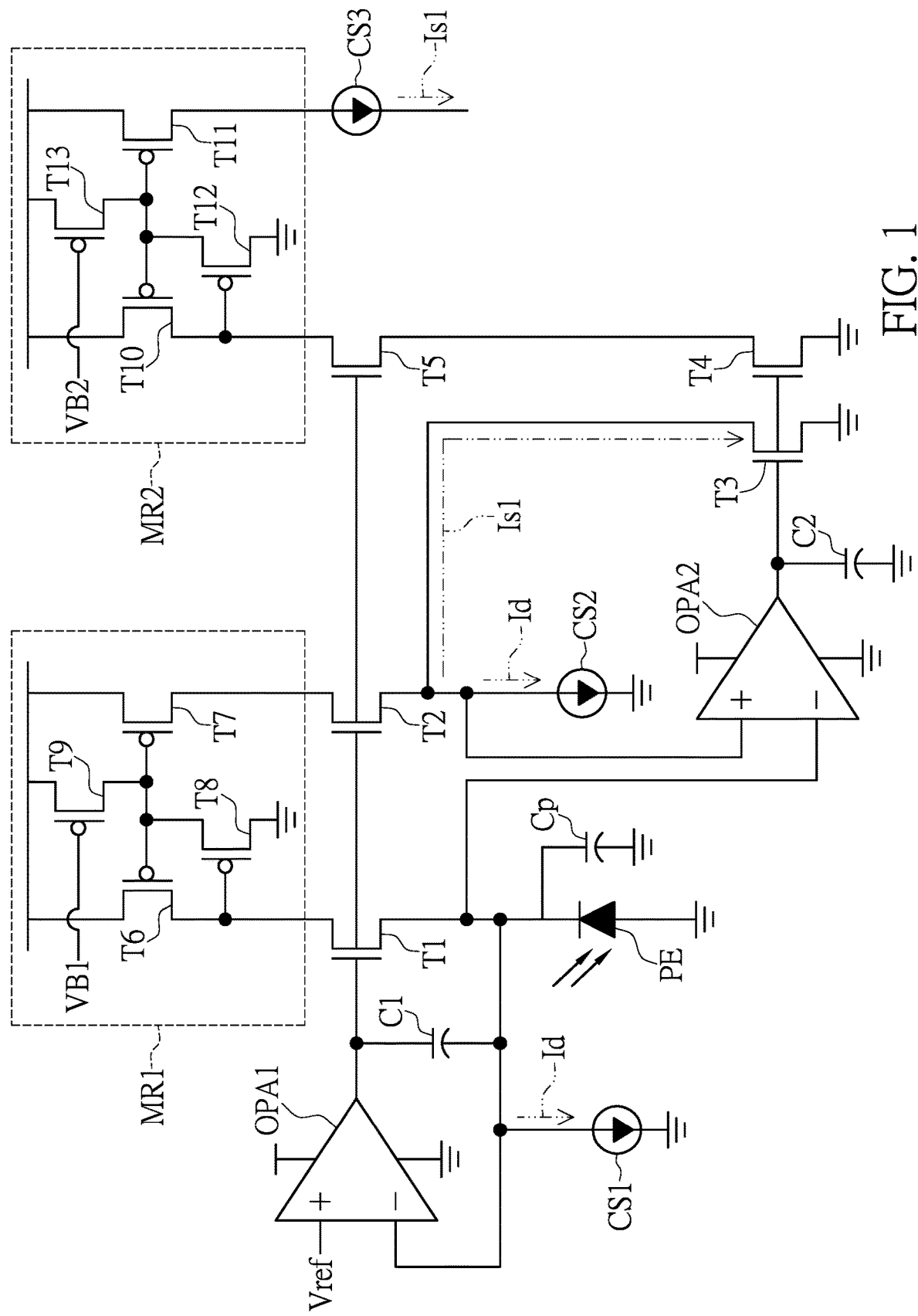
FIG. 1 is a circuit layout diagram of a sensor according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Reference is made to FIG. 1, which is a circuit layout diagram of a sensor according to a first embodiment of the present disclosure.

As shown in FIG. 1, in the embodiment, the sensor may include a photodiode PE and a first operational amplifier OPA1. A first input terminal of the first operational amplifier OPA1 is coupled to a reference voltage Vref. A second input terminal of the first operational amplifier OPA1 is connected to a cathode of the photodiode PE. An anode of the photodiode PE is grounded.

After a transmitter (not shown in figures) emits a light signal toward an object such as person and then the light signal is reflected to the photodiode PE by the object, the photodiode PE converts energy of the light signal passing through the photodiode PE into a photocurrent. However, a parasitic capacitor Cp of the photodiode PE is also charged at the same time such that an extra charge of the parasitic capacitor Cp affects the photocurrent. As a result, the photodiode PE cannot operate normally.

Therefore, in the embodiment, the sensor further includes a first current source CS1. A first terminal of the first current source CS1 is connected to the cathode of the photodiode PE. A second terminal of the first current source CS1 is grounded. When the light signal stops passing through the photodiode PE, the first current source CS1 biases the parasitic capacitor Cp of the photodiode PE such that the parasitic capacitor Cp is discharged through the first current source CS1 toward a ground and an extra charge of the parasitic capacitor Cp is reduced.

After the first current source CS1 is disposed, a current outputted by the sensor not only includes a photocurrent Is1 of the photodiode PE, but also includes an additional current Id. That is, the current outputted by the sensor includes a current supplied by the first current source CS1 which is for a discharge current of the parasitic capacitor Cp. However, the current outputted by the sensor should only include the photocurrent Is1 of the photodiode PE.

Therefore, in the embodiment, the sensor further includes a first transistor T1, a firsts current mirror circuit MR1, a second transistor T2, a second operational amplifier OPA2, a second current source CS2 and a third transistor T3.

A control terminal of the first transistor T1 is connected to an output terminal of the first operational amplifier OPA1. A first terminal of the first transistor T1 is connected to the cathode of the photodiode PE. A second terminal of the first transistor T1 is connected to an input terminal of the first current mirror circuit MR1.

An output terminal of the first current mirror circuit MR1 is connected to a first terminal of the second transistor T2. A control terminal of the second transistor T2 is connected to the output terminal of the first operational amplifier OPA1. A second terminal of the second transistor T2 is connected to a first terminal of the second current source CS2. A second terminal of the second current source CS2 is grounded.

In detail, the first current mirror circuit MR1 may include a sixth transistor T6 and a seventh transistor T7. A first terminal of the sixth transistor T6 and a first terminal of the seventh transistor T7 may be coupled to a common voltage. A second terminal of the sixth transistor T6 is connected to the second terminal of the first transistor T1. A second terminal of the seventh transistor T7 is connected to the first terminal of the second transistor T2. A control terminal of the seventh transistor T7 is connected to a control terminal of the sixth transistor T6.

If necessary, the first current mirror circuit MR1 may further include an eighth transistor T8, a ninth transistor T9, or a combination thereof.

A control terminal of the eighth transistor T8 may be connected to the second terminal of the first transistor T1. A first terminal of the eighth transistor T8 may be connected to the control terminal of the sixth transistor T6 and a second terminal of the ninth transistor T9. A second terminal of the eighth transistor T8 may be grounded.

A first terminal of the ninth transistor T9 may be coupled to the common voltage. A second terminal of the ninth transistor T9 may be connected to the control terminal of the sixth transistor T6, the control terminal of the seventh transistor T7 and the first terminal of the eighth transistor T8. A control terminal of the ninth transistor T9 may be connected to a first control voltage VB1.

It is worth noting that, a first input terminal such as an inverting input terminal of the second operational amplifier OPA2 is connected to a node (referred to a first node in the following) between the first terminal of the first transistor T1 and the cathode of the photodiode PE. A second input terminal such as a non-inverting input terminal of the second operational amplifier OPA2 is connected to a node (that is called a second node in the following) between the second terminal of the second transistor T2 and the first terminal of the second current source CS2.

A control terminal of the third transistor T3 is connected to an output terminal of the second operational amplifier OPA2. A first terminal of the third transistor T3 is connected to the second node. A second terminal of the third transistor T3 is grounded.

It should be understood that, a voltage of the first input terminal of the second operational amplifier OPA2 is equal to a voltage of the second input terminal of the second operational amplifier OPA2. Furthermore, in the embodiment, a size and characteristics of the second transistor T2 are exactly the same as those of the first transistor T1. Under this condition, a voltage of the first node is equal to a voltage of the second node. As a result, a current Id of the second terminal of the second transistor T2 (that is a current of the second current source CS2) is exactly equal to the current Id of the first current source CS1 such that a current Is1 flowing to the first terminal of the third transistor T3 is equal to the photocurrent sensed by the photodiode PE of the senor of the embodiment.

A ratio of an input current of the first current mirror circuit MR1 to an output current of the first current mirror circuit MR1 may be 1:N, where N is any appropriate integer. In the embodiment, the ratio of the input current of the first current mirror circuit MR1 to the output current of the first current mirror circuit MR1 is 1:1, but the present disclosure is not limited thereto. If the ratio is 1:1, the current Is1 flowing to the first terminal of the third transistor T3 is equal to the photocurrent of the photodiode PE. If the ratio is N, the second transistor T2 and the second current source CS2 need to be N times of the first transistor T1 and the first current source CS1 respectively. The current Is1 flowing to the first terminal of the third transistor T3 will be N times of the photocurrent of the photodiode PE.

If necessary, the sensor of the embodiment may further include a first capacitor C1, a second capacitor C2, or a combination thereof. A first terminal of the first capacitor C1 may be connected to the output terminal of the first operational amplifier OPA1. A second terminal of the first capacitor C1 may be connected to the cathode of the photodiode PE. A first terminal of the second capacitor C2 may be connected to the output terminal of the second operational amplifier OPA2. A second terminal of the second capacitor C2 may be grounded.

In addition, in the embodiment, the sensor may further include a fourth transistor T4. A control terminal of the fourth transistor T4 is connected to the output terminal of the second operational amplifier OPA2. A first terminal of the fourth transistor T4 may be connected to the common voltage. A second terminal of the fourth transistor T4 is grounded.

In the embodiment, the sensor may further include a fifth transistor T5. A control terminal of the fifth transistor T5 is connected to the output terminal of the first operational amplifier OPA1. A first terminal of the fifth transistor T5 is connected to the first terminal of the fourth transistor T4. A second terminal of the fifth transistor T5 is coupled to the common voltage.

If necessary, the sensor of the embodiment may further include a second current mirror circuit MR2 and a third current source CS3. An input terminal of the second current mirror circuit MR2 is connected to the second terminal of the fifth transistor T5. The current Is1 outputted by the third current source CS3 (that is an output current of an output terminal of the second current mirror circuit MR2) is a current outputted by the output terminal of the sensor of the embodiment of the present disclosure.

In detail, the second current mirror circuit MR2 may include a tenth transistor T10 and an eleventh transistor T11. A first terminal of the tenth transistor T10 and a first terminal of the eleventh transistor T11 may be coupled to the common voltage. A second terminal of the tenth transistor T10 is connected to the second terminal of the fifth transistor T5. A control terminal of the eleventh transistor T11 is connected to a control terminal of the tenth transistor T10. A second terminal of the eleventh transistor T11 is an output terminal of the sensor of the embodiment of the present disclosure.

If necessary, the second current mirror circuit MR2 may further include a twelfth transistor T12, a thirteenth transistor T13, or a combination thereof. A control terminal of the twelfth transistor T12 may be connected to the second terminal of the fifth transistor T5. A first terminal of the twelfth transistor T12 may be connected to the control terminal of the tenth transistor T10 and the control terminal of the eleventh transistor T11. A second terminal of the twelfth transistor T12 is grounded.

A first terminal of the thirteenth transistor T13 may be coupled to the common voltage. A second terminal of the thirteenth transistor T13 may be connected to the control terminal of the tenth transistor T10 and the control terminal of the tenth transistor T11. A control terminal of the thirteenth transistor T13 may be coupled to a second control voltage VB2. The second terminal of the eleventh transistor T11 may be connected to the third current source CS3.

A ratio of an input current of the second current mirror circuit MR2 to an output current of the second current mirror circuit MR2 may be 1:N, where N is any appropriate integer. Under this condition, the second current mirror circuit MR2 amplifies the input current of the second current mirror circuit MR2 to output the output current that is N times the input current of the second current mirror circuit MR2. In the embodiment, the ratio of the input current of the second current mirror circuit MR2 to the output current of the second current mirror circuit MR2 is 1:1, but the present disclosure is not limited thereto. If the ratio is 1:1, the current Is1 outputted by the sensor of the embodiment is equal to the current Is1 flowing to the first terminal of the third transistor T3.

Figure 2:
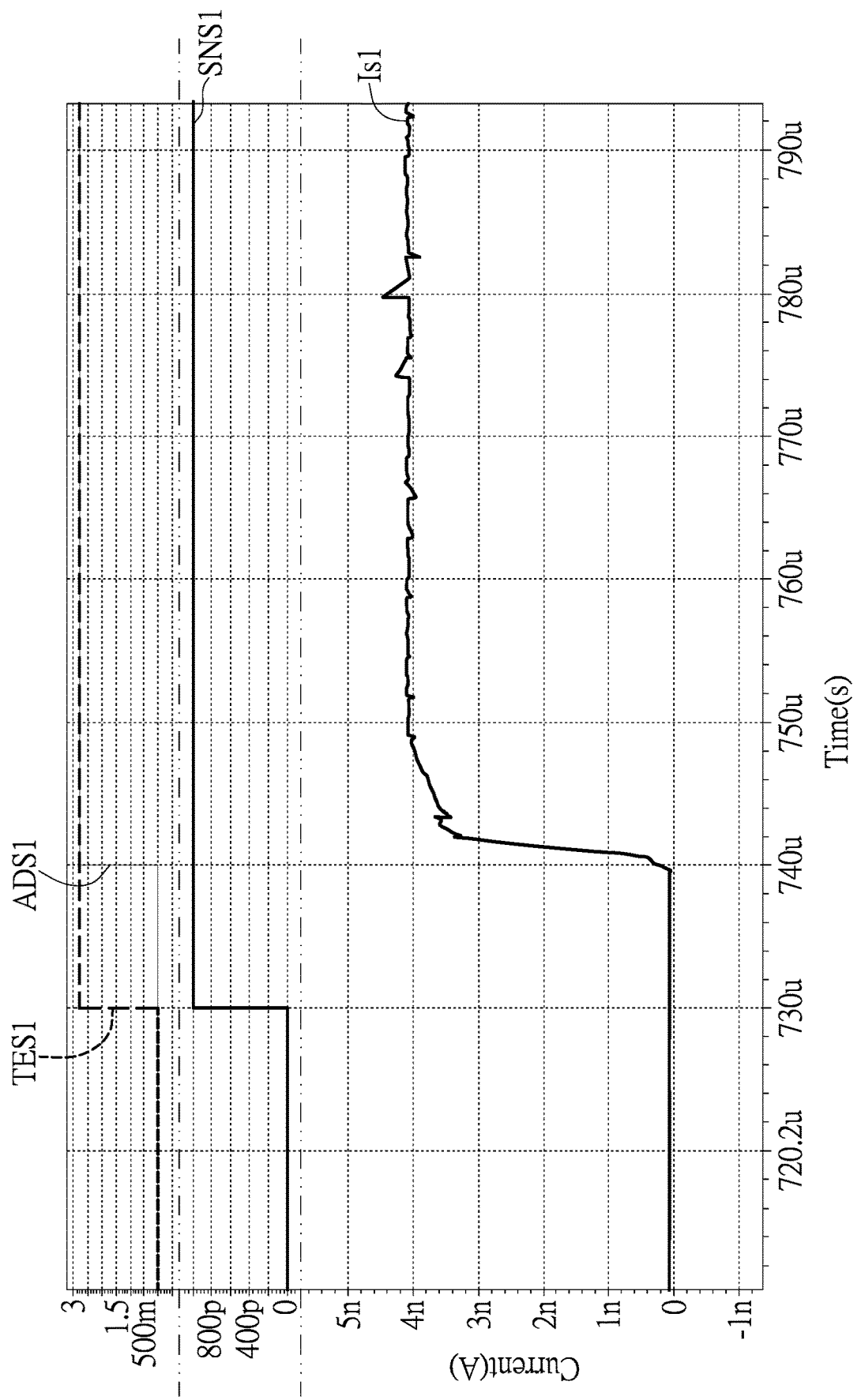
FIG. 2 is a waveform diagram of the sensor according to the first embodiment of the present disclosure.
Figure 5:
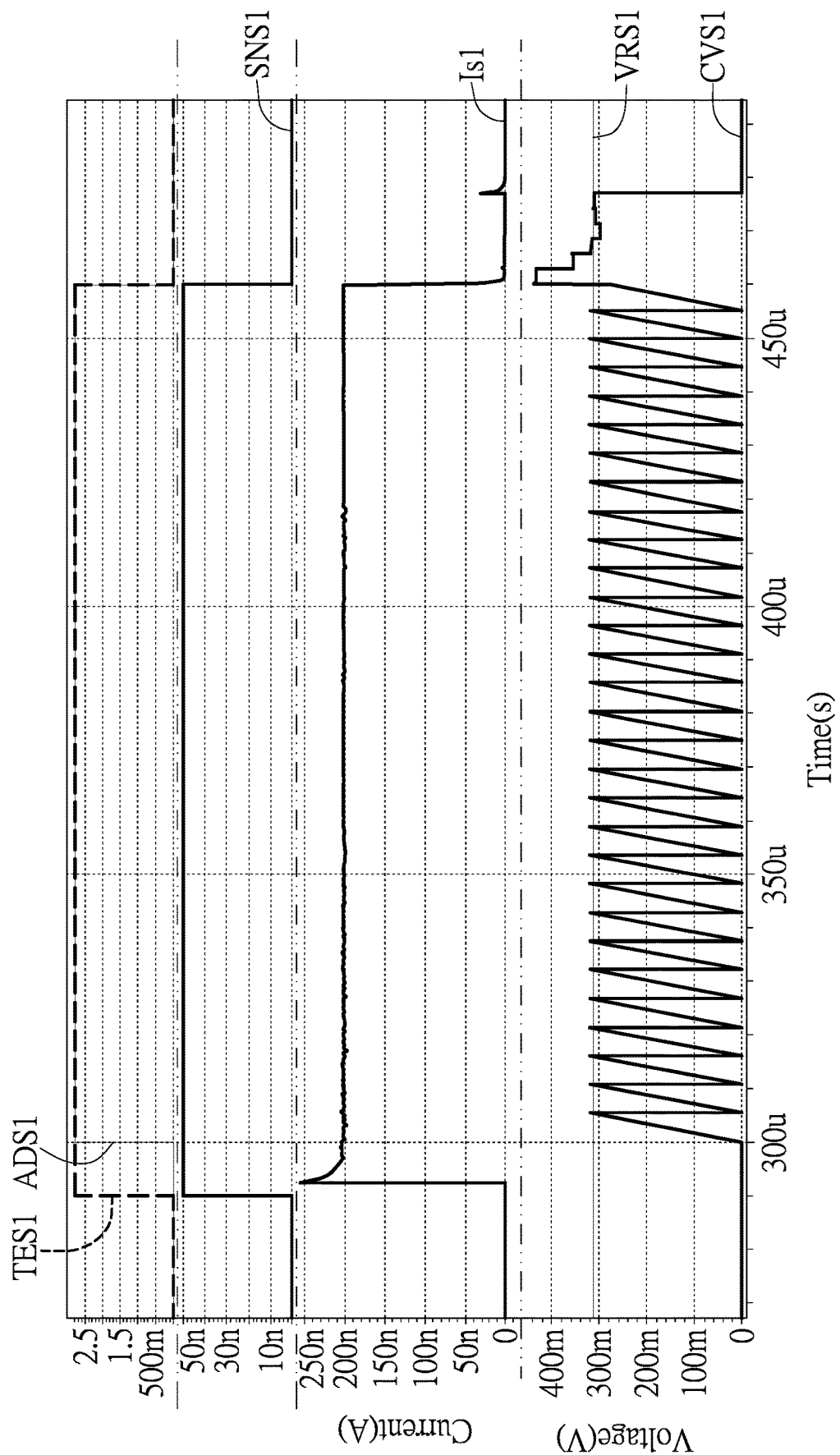
FIG. 5 is a waveform diagram of the sensor according to the first embodiment of the present disclosure.

Reference is made to FIGS. 1 to 5, in which FIGS. 2 and 5 are waveform diagrams of the sensor according to the first embodiment of the present disclosure.

The above-mentioned transmitter starts to emit the light signal toward the object at a time point of a rising edge of a light emission time signal TES1 shown in FIGS. 2 to 5. The transmitter emits the light signal toward the object for a period of time during which the light emission time signal TES1 is at a high level. The photodiode PE shown in FIG.

1 converts the light signal reflected by the object into the photocurrent and finally the output terminal of the sensor outputs the current Is1 shown in FIGS. 1 to 5.

A processor circuit (such as an analog-digital converter) connected to the output terminal of the sensor starts to process a signal of the current Is1 outputted by the sensor shown in FIG. 1 at a time point at which an analog-digital processing signal ADS1 shown in FIGS. 2 to 5 transits from a low level to a high level. For example, the signal of the current Is1 is converted from an analog form into a digital form. A time interval during which an operational signal SNS1 shown in FIGS. 2 to 5 is at a high level represents a time interval from a starting time at which the transmitter starts to emit the light signal to an end time at which the process of the signal of the current Is1 is completed.

Figure 3:
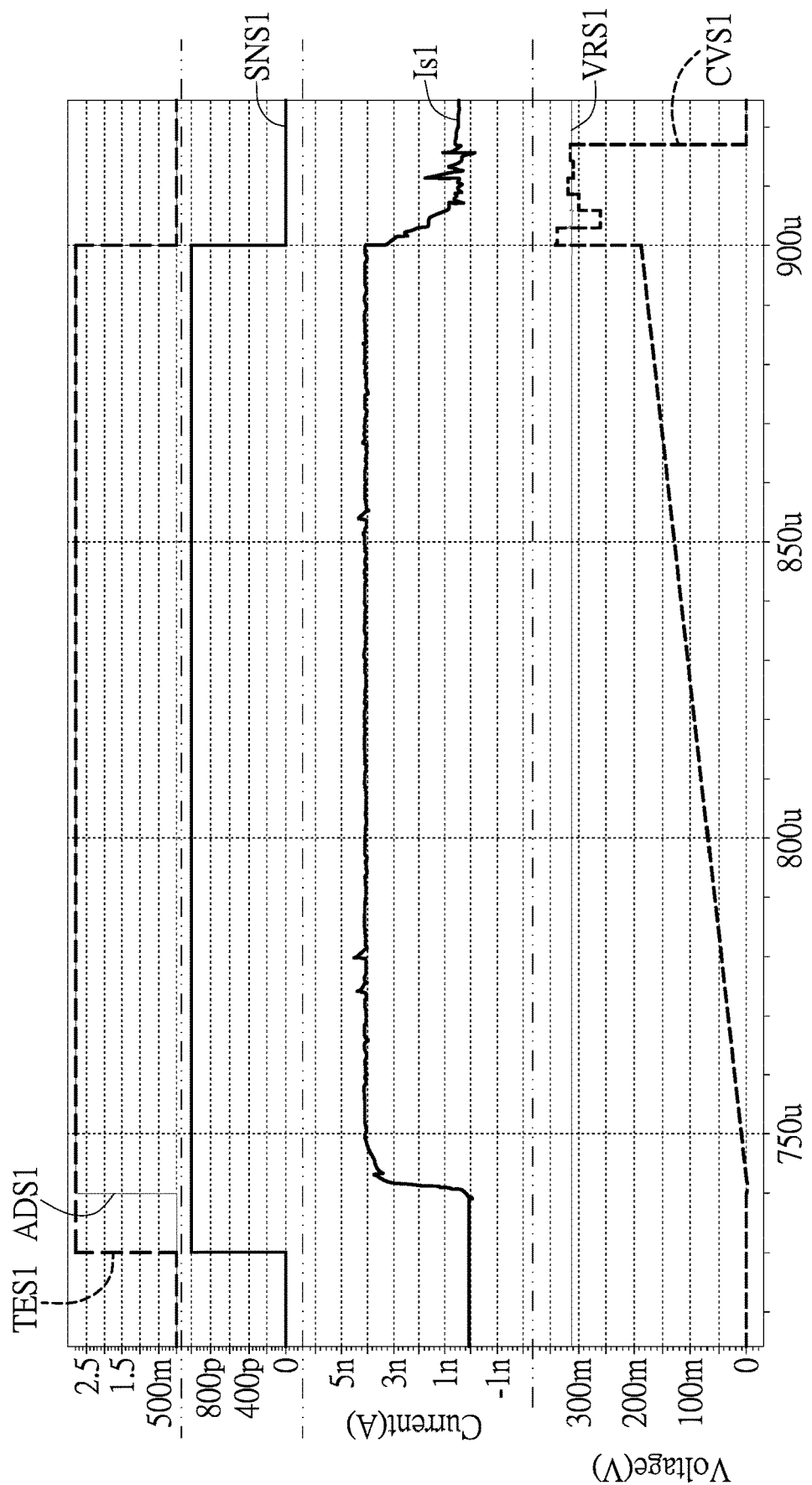
FIG. 3 is a waveform diagram of the sensor according to the first embodiment of the present disclosure.
Figure 4:
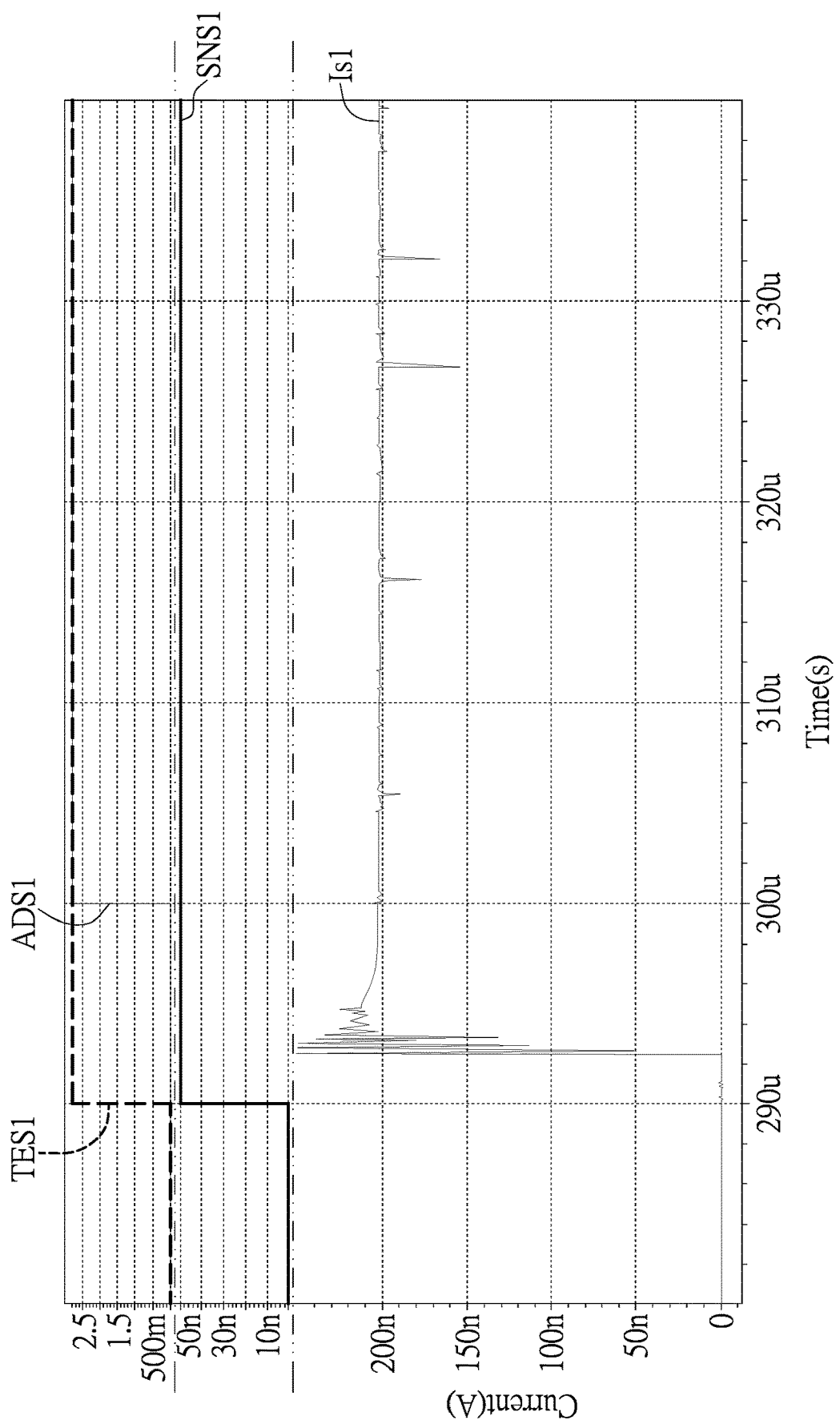
FIG. 4 is a waveform diagram of the sensor according to the first embodiment of the present disclosure.

For example, the output terminal of the sensor shown in FIG. 1 (that is the second terminal of the eleventh transistor T11) may be connected to a charge capacitor (not shown in figures). The charge capacitor is charged by the current Is1 such that a signal of a voltage of the charge capacitor gradually rises, which is represented by a capacitor voltage signal CVS1 as shown in FIGS. 3 and 5. When the voltage of the charge capacitor reaches a voltage of a reference voltage signal VRS1 as shown in FIGS. 3 and 5, a voltage signal of the charge capacitor is pulled down to a valley value by the processor circuit. After a period of time has elapsed, the voltage of the charge capacitor is charged to reach the voltage of the reference voltage signal VRS1 from the valley value again.

A counter of the processor circuit may count the number of times that the charge capacitor is charged and discharged. That is, the counter counts the number of waveforms of the capacitor voltage signal CVS1. A distance between the object and an electronic device (such as a cell phone) to which the sensor as shown in FIG. 1 is applied is determined according to the counted number.

Second Embodiment

Figure 6:
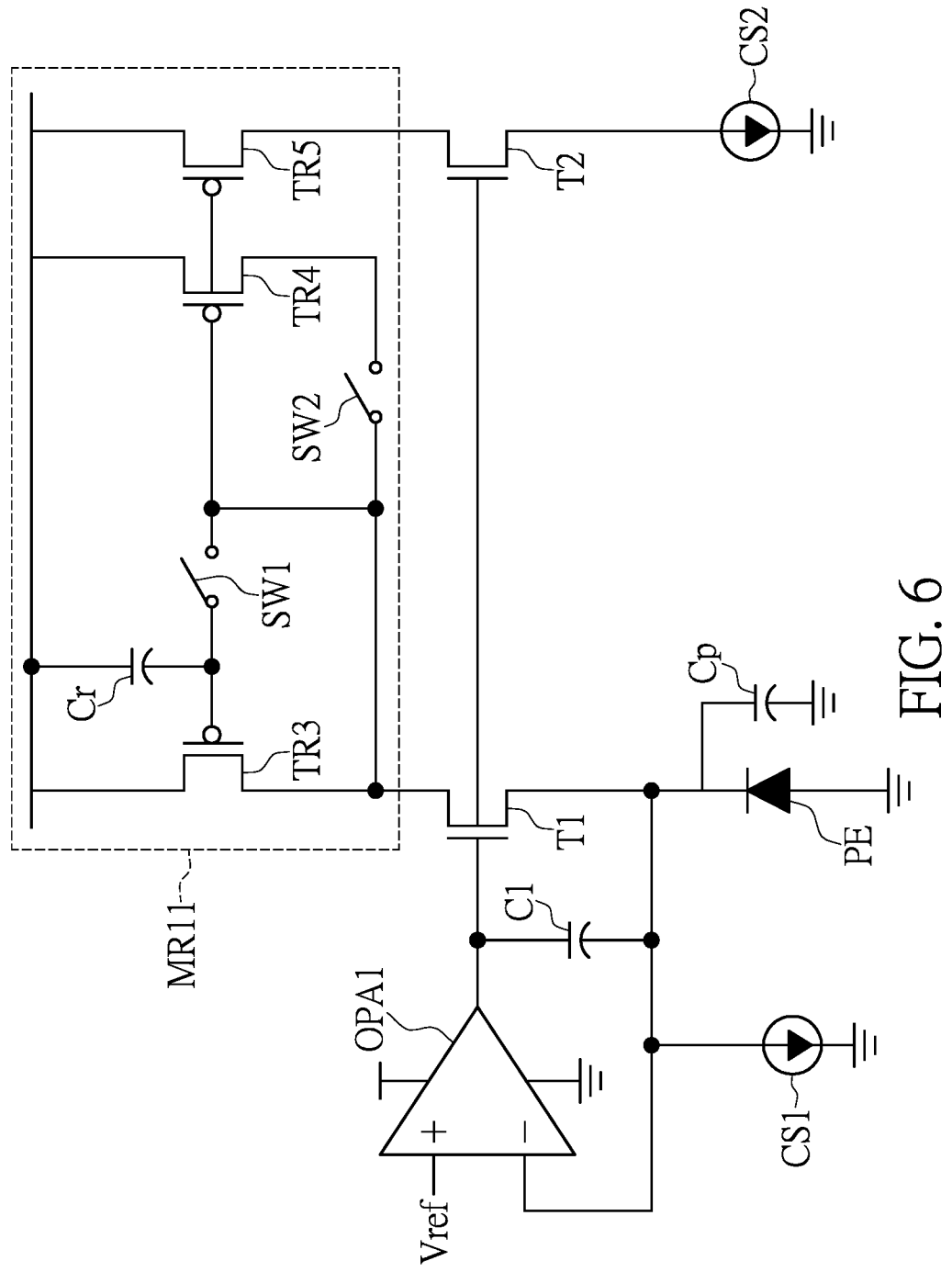
FIG. 6 is a circuit layout diagram of a sensor according to a second embodiment of the present disclosure.
Figure 7:
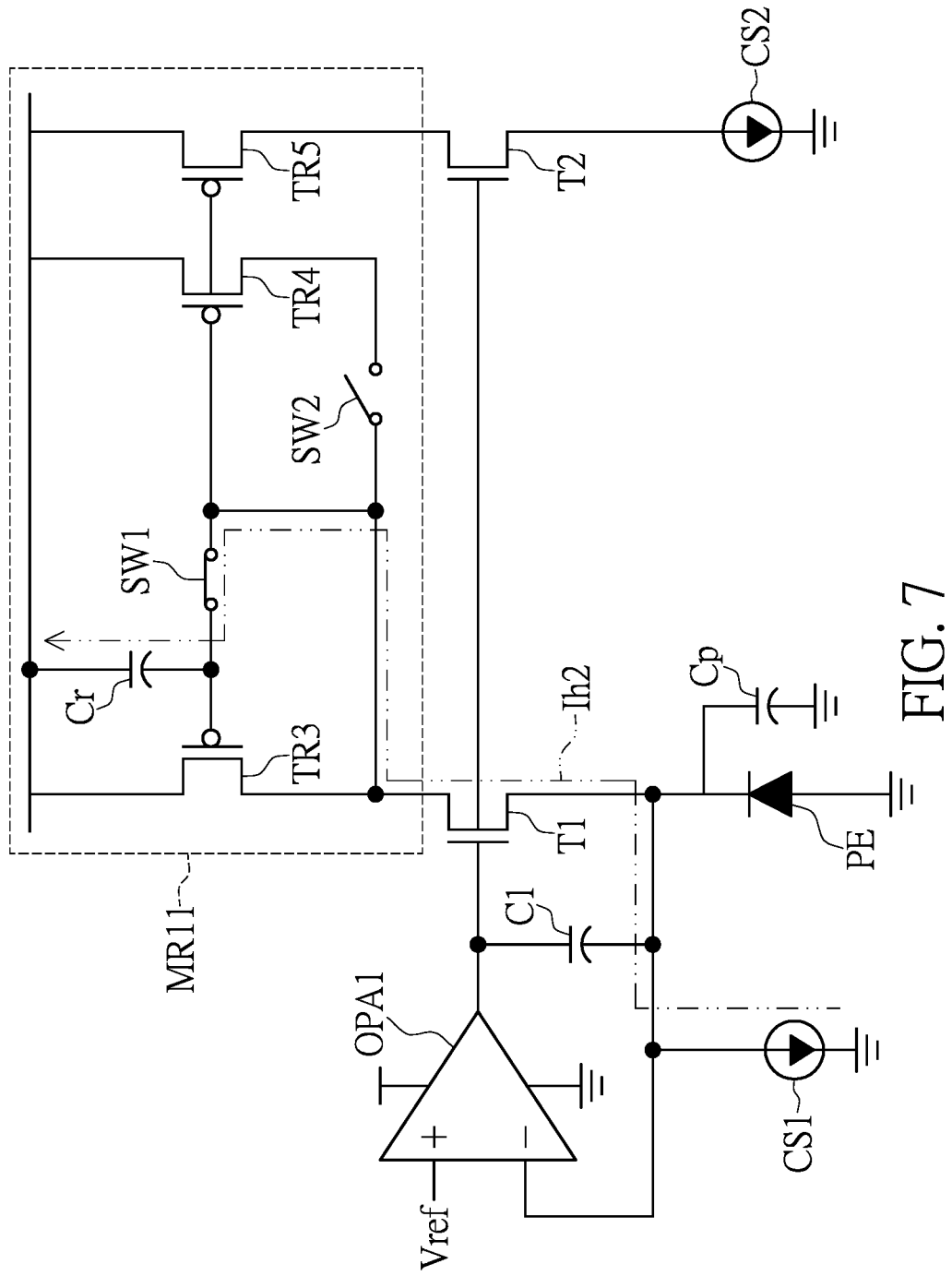
FIG. 7 is a schematic diagram of a flow direction of a charging current of a pre-charge capacitor of the sensor according to the second embodiment of the present disclosure.
Figure 8:
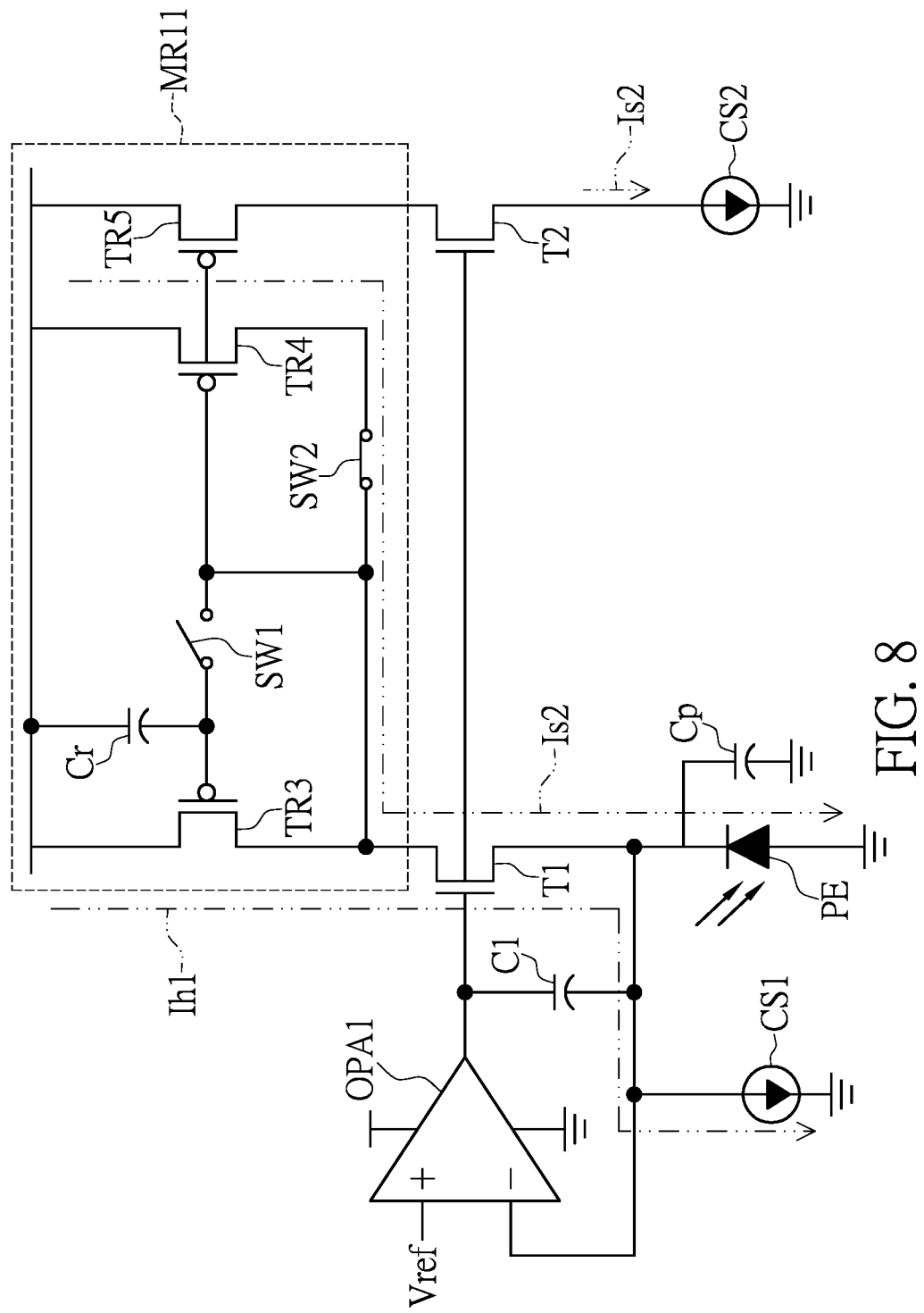
FIG. 8 is a schematic diagram of a flow direction of a current of the sensor according to the second embodiment of the present disclosure.

Reference is made to FIGS. 6 to 8, in which FIG. 6 is a circuit layout diagram of a sensor according to a second embodiment of the present disclosure.

In the embodiment, the sensor may include a photodiode PE, a first operational amplifier OPA1, a first current source CS1, a first transistor T1, a second transistor T2, a second current source CS2, a first current mirror circuit MR11 as shown in FIG. 6. The same descriptions of the second and first embodiments are not repeated herein.

It is worth noting that, in the embodiment, the sensor further includes a pre-charger capacitor Cr connected to the first current mirror circuit MR11.

In detail, the first current mirror circuit MR11 may include a third transistor TR3, a fourth transistor TR4 and a fifth transistor TR5. A first terminal of the third transistor TR3, a first terminal of the fourth transistor TR4 and a first terminal of the fifth transistor TR5 may be coupled to the common voltage.

A second terminal of the third transistor TR3 is connected to the second terminal of the first transistor T1 and a control terminal of the third transistor TR3. The control terminal of the third transistor TR3 is connected to a second terminal of the pre-charge capacitor Cr. A first terminal of the pre-charge capacitor Cr may be coupled to the common voltage. A control terminal of the fourth transistor TR4 may be connected to the control terminal of the third transistor TR3, a second terminal of the fourth transistor TR4 and a control terminal of the fifth transistor TR5. A second terminal of the fifth transistor TR5 is connected to the first terminal of the second transistor T2.

In addition, in the embodiment, the sensor may further include a first switch component SW1 and a second switch component SW2 as shown in FIG. 6.

A first terminal of the first switch component SW1 may be connected to the control terminal of the third transistor TR3. A second terminal of the first switch component SW1 may be connected to the second terminal of the first transistor T1 and the control terminal of the fourth transistor TR4. A first terminal of the second switch component SW2 may be connected to the second terminal of the first transistor T1 and the second terminal of the first switch component SW1. A second terminal of the second switch component SW2 may be connected to the second terminal of the fourth transistor TR4.

As shown in FIG. 7, before the transmitter emits the light signal toward the object and the light signal is reflected to the photodiode PE, the first switch component SW1 is turned on and the second switch component SW2 is turned off, and the first current source CS1 supplies a current Ih2 to the pre-charge capacitor Cr to charge a voltage of the pre-charge capacitor Cr.

After the transmitter emits the light signal toward the object for a period of time, the light signal is reflected to the photodiode PE and passes through the photodiode PE. At this time, as shown in FIG. 8, the first switch component SW1 is turned off and the second switch component SW2 is turned on. The pre-charge capacitor Cr stores current information of the current Ih2 on a previous stage in the control terminal of the third transistor TR3. The transistor TR3 is discharged to output a current Ih1 flowing through the first current source CS1 to a ground. The current Ih1 is equal to the current Ih2. At the same time, a photocurrent Is2 sensed by the photodiode PE flows from the fourth transistor TR4 such that the fifth transistor TR5 of the first current mirror circuit MR11 outputs a current that is equal to the photocurrent Is2 sensed by the photodiode PE. The current outputted by the fifth transistor TR5 only includes the photocurrent Is2 but not the current of the first current source CS1.

If the ratio of the input current of the first current mirror circuit MR11 to the output current of the first current mirror circuit MR11 is 1:N, the current outputted by the sensor shown in FIG. 8 is N times the photocurrent Is2 of the photodiode PE. In the embodiment, N=1. Therefore, as shown in FIG. 8, the current outputted by the sensor is equal to the photocurrent Is2 of the photodiode PE, but the present disclosure is not limited thereto.

Figure 9:
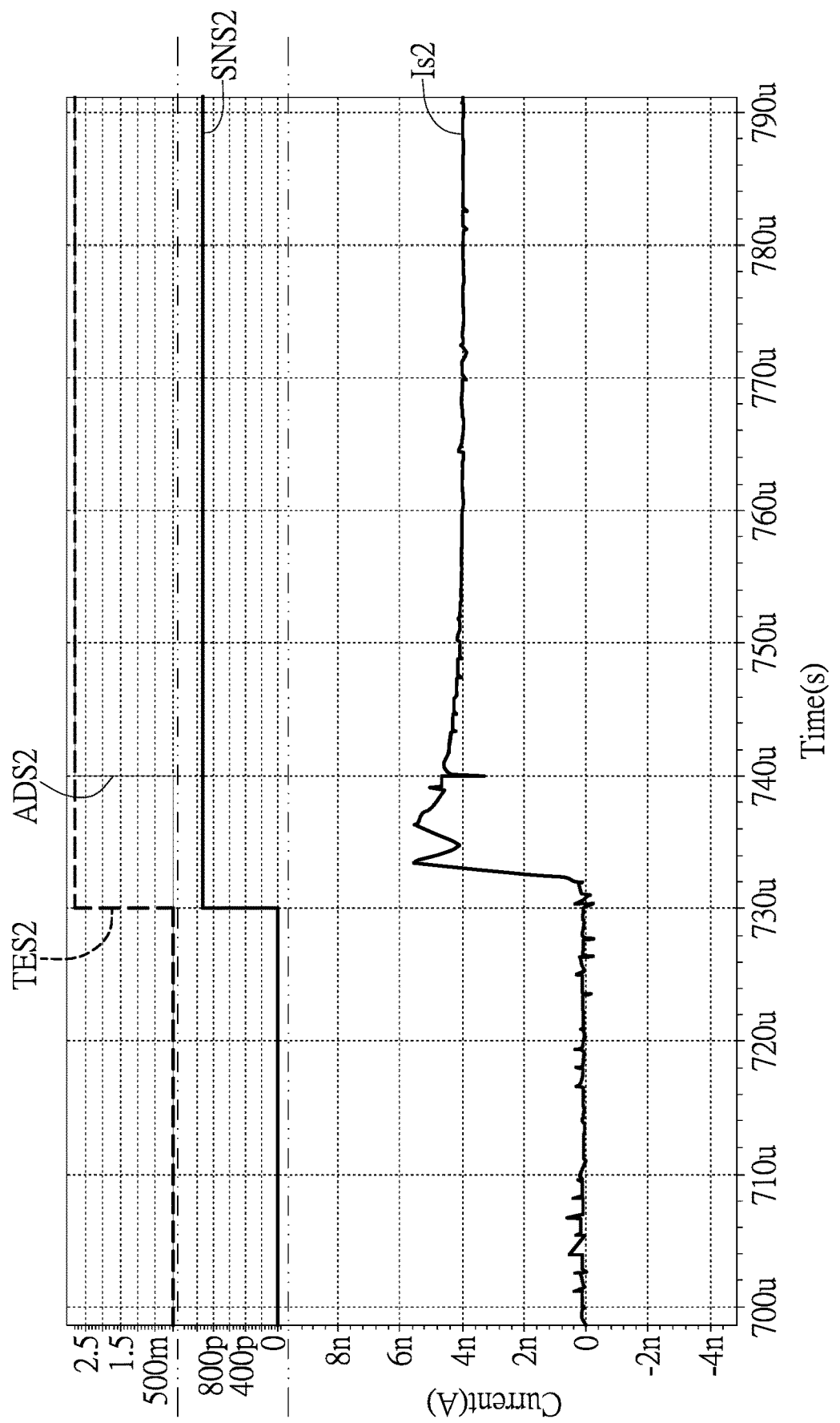
FIG. 9 is a waveform diagram of the sensor according to the second embodiment of the present disclosure.
Figure 10:
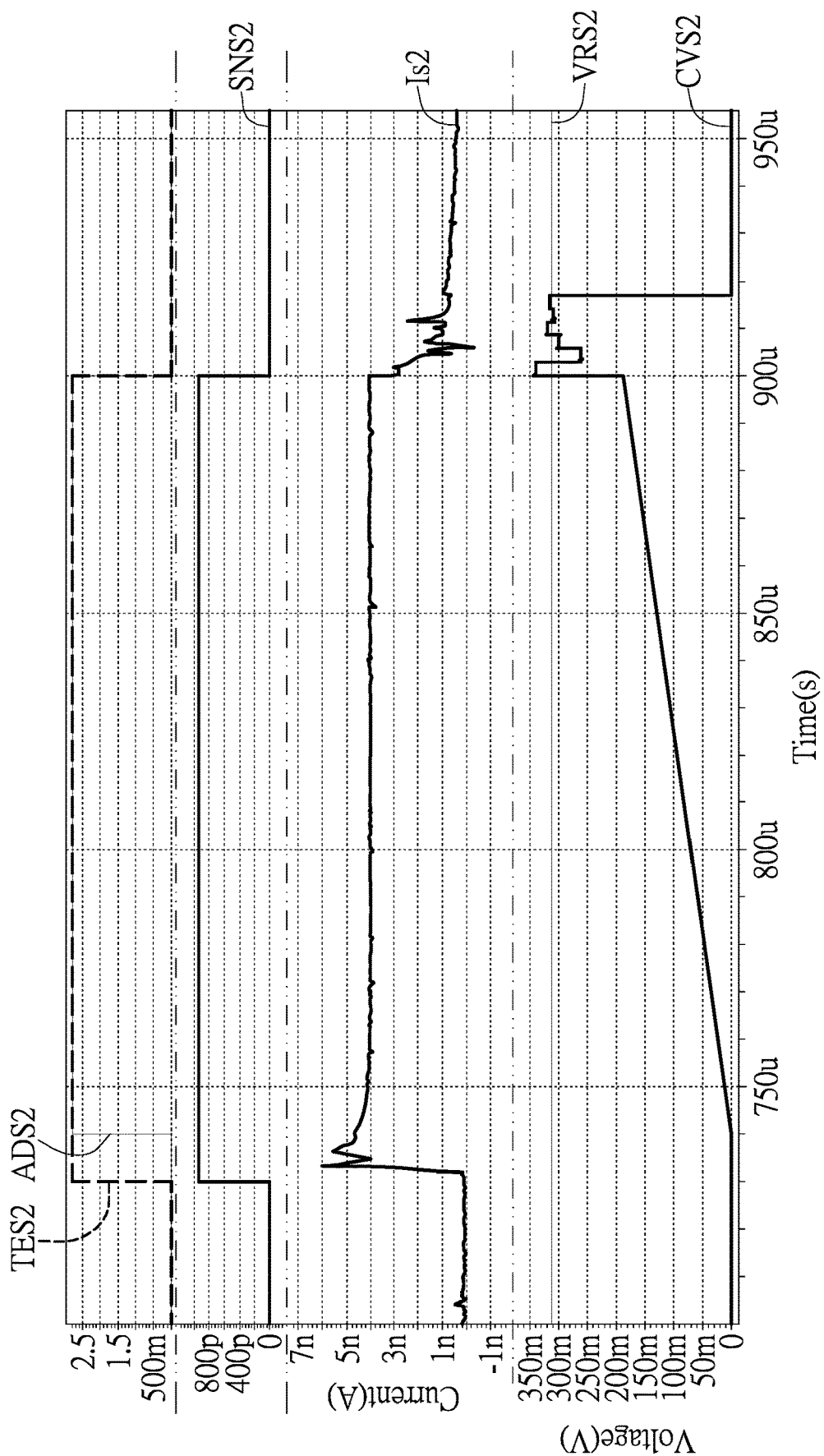
FIG. 10 is a waveform diagram of the sensor according to the second embodiment of the present disclosure.
Figure 11:
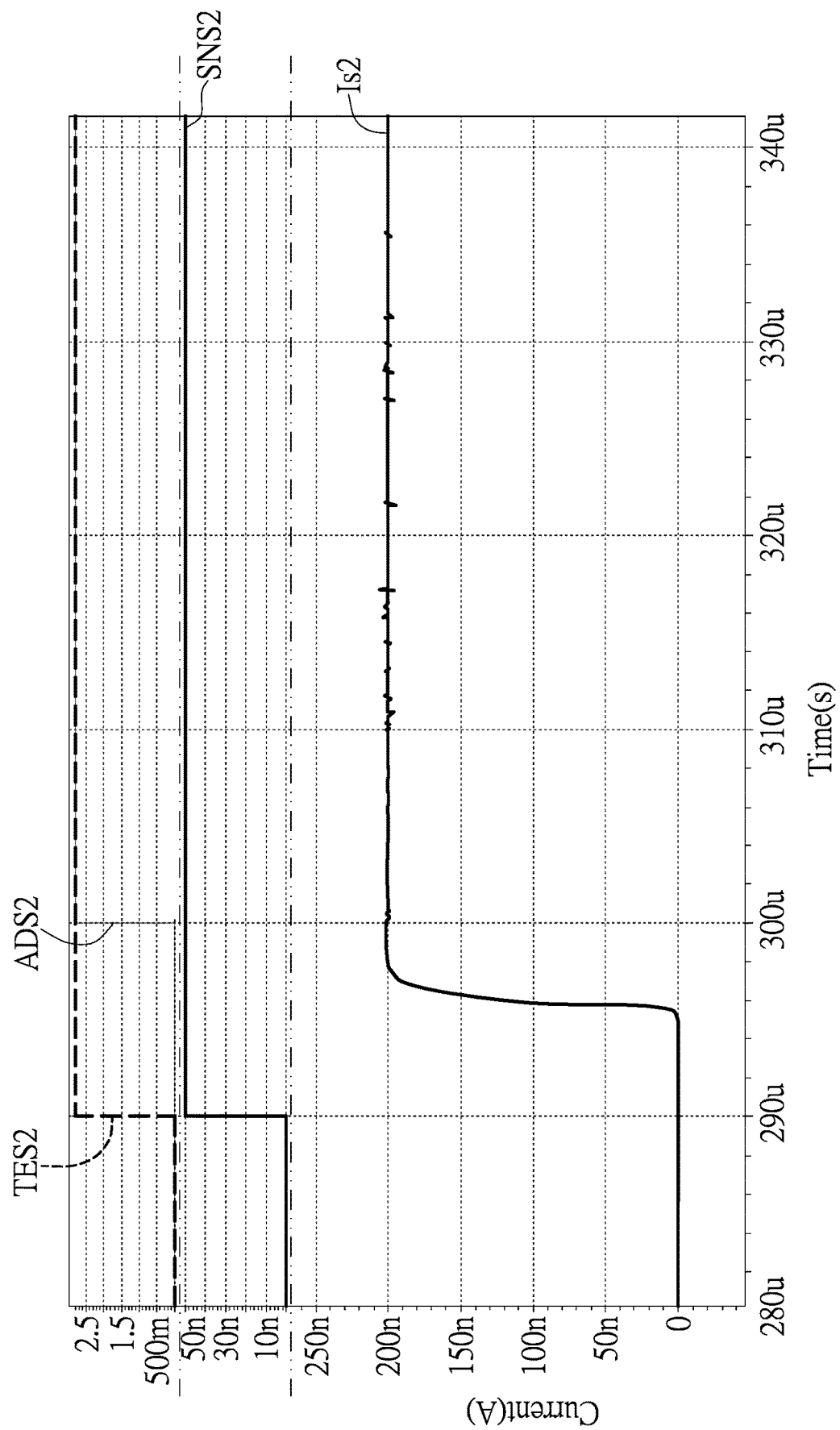
FIG. 11 is a waveform diagram of the sensor according to the second embodiment of the present disclosure.
Figure 12:
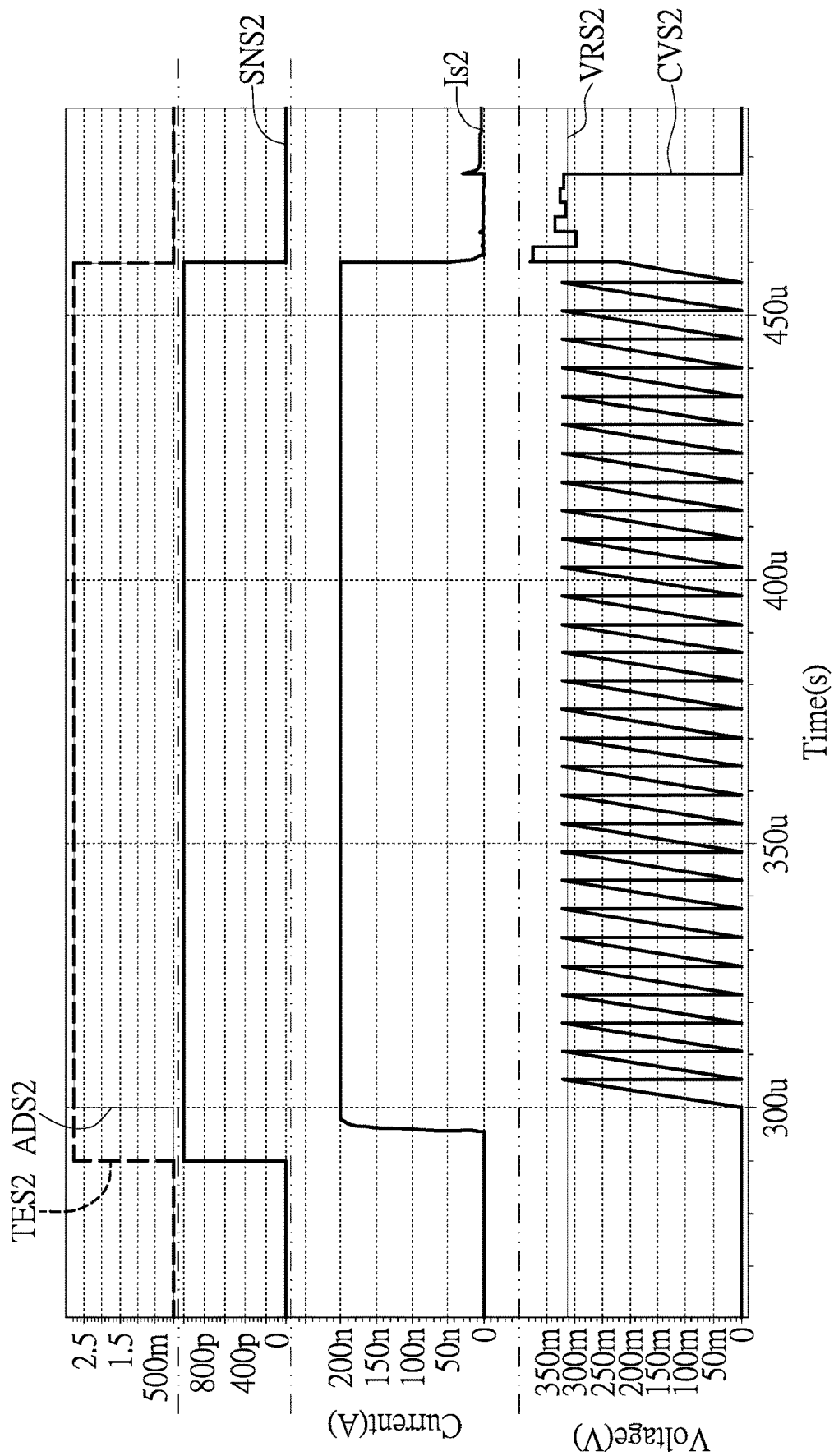
FIG. 12 is a waveform diagram of the sensor according to the second embodiment of the present disclosure.

Reference is made to FIGS. 9 to 12, in which FIG. 9 is a waveform diagram of the sensor according to the second embodiment of the present disclosure.

The transmitter starts to emit the light signal toward the object at a time point of a rising edge of a light emission time signal TES2 shown in FIGS. 8 to 12. The transmitter emits the light signal toward the object for a period of time during which the light emission time signal TES2 is at a high level. The photodiode PE shown in FIG. 8 converts the light signal into the photocurrent and finally the output terminal of the sensor outputs the current that is equal to the photocurrent Is2 shown in FIGS. 9 to 12.

The processor circuit (such as the analog-digital converter) connected to the output terminal of the sensor starts to process the current that is equal to the photocurrent Is2 and outputted by the sensor at a time point at which an analog-digital processing signal ADS2 shown in FIGS. 9 to 12 transits from a low level to a high level. For example, the signal of the current that is equal to the photocurrent Is2 is converted from an analog form into a digital form.

For example, the output terminal of the sensor shown in FIG. 8 (that is the second terminal of the second transistor T2) may be connected to a charge capacitor (not shown in figures). The charge capacitor is charged by the current that is equal to the photocurrent Is2 and outputted by the senor such that a signal of a voltage of the charge capacitor gradually rises, which is represented by a capacitor voltage signal CVS1 shown in FIGS. 10 and 12. When the voltage of the charge capacitor reaches a voltage of a reference voltage signal VRS2 shown in FIGS. 10 and 12, the voltage of the charge capacitor is pulled down to a valley value by the processor circuit. After a period of time has elapsed, the charge capacitor is charged to reach the voltage of the reference voltage signal VRS1 from the valley value again.

A counter of the processor circuit may count the number of times that the charge capacitor is charged and discharged. That is, the counter counts the number of waveforms of the capacitor voltage signal CVS2. A distance between the object and the electronic device (such as the cell phone) to which the sensor shown in FIG. 8 is applied is determined according to the counted number.

Figure 13:
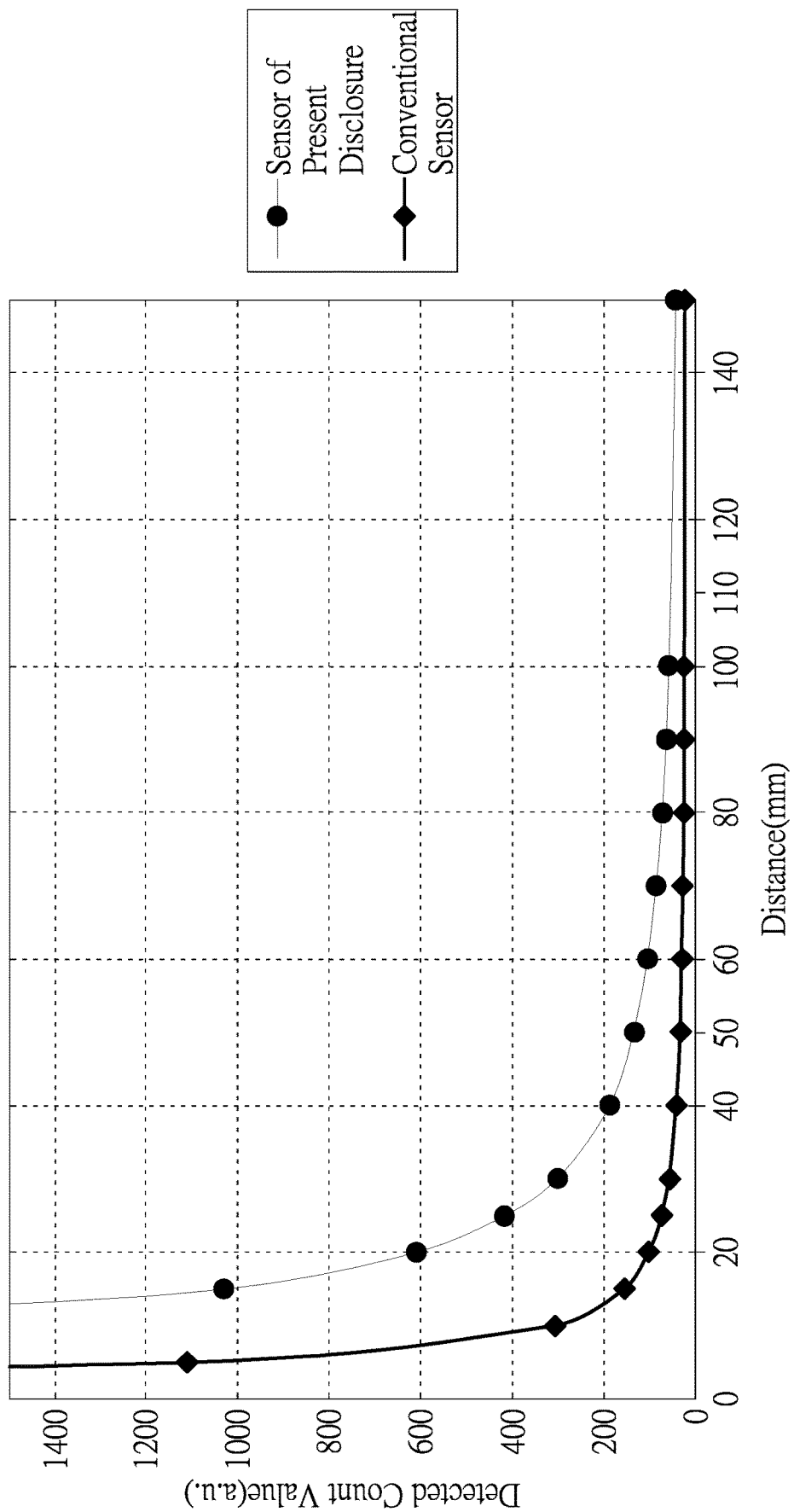
FIG. 13 is a curve diagram of the sensor according to the first and second embodiments of the present disclosure and a conventional sensor.

Reference is made to FIG. 13, which is a curve diagram of the sensor according to the first and second embodiments of the present disclosure and a conventional sensor.

As shown in FIG. 13, a horizontal axis of the curve diagram represents a distance between the object and the sensor, and a vertical axis of the curve diagram represents a count value detected by the sensor. The count value is the number of times that the charge capacitor is charged and discharged and counted by the sensor. For example, the count value is the number of the waveforms of the capacitor voltage signal CVS2 shown in FIG. 12. The distance between the object and the electronic device (such as the cell phone) may be determined according to the count value detected by the sensor.

It should be understood that the farther the distance that is detectable by the sensor, the better. As shown in FIG. 13, the conventional sensor can only detect up to a short distance of 5 cm. When the distance between the object and the electronic device is larger than 5 cm, a value counted by the conventional sensor is not correct and thus the distance cannot be correctly calculated according to the value counted by the conventional sensor. In contrast, the sensor of the present disclosure can detect for a distance of up to 11 cm. It is therefore apparent that the sensor of the present disclosure has better efficacy than that of the conventional sensor.

In summary, the present disclosure provides the sensor in which the current source is disposed and connected to the cathode of the photodiode such that a discharging path of the parasitic capacitor of the photodiode is formed. As a result, after the light stops passing through the photodiode, the parasitic capacitor does not have an extra charge and the voltage of the cathode of the photodiode is not affected by the voltage of the parasitic capacitor. Therefore, the photodiode can operate normally. It is worth noting that, the sensor of the present disclosure includes the bias circuit of the photodiode such that the current sensed by the sensor only includes the photocurrent that is converted from the light signal by the photodiode, but not the current provided by the current source.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor, comprising:
    a photodiode, wherein an anode of the photodiode is grounded, and the photodiode is configured to convert energy of light passing through the photodiode into a photocurrent;
    a first operational amplifier, wherein a first input terminal of the first operational amplifier is coupled to a reference voltage, and a second input terminal of the first operational amplifier is connected to a cathode of the photodiode;
    a first current source, wherein a first terminal of the first current source is connected to the cathode of the photodiode and a second terminal of the first current source is grounded;
    a first transistor, wherein a control terminal of the first transistor is connected to an output terminal of the first operational amplifier, and a first terminal of the first transistor is connected to the cathode of the photodiode;
    a second transistor, wherein a control terminal of the second transistor is connected to the output terminal of the first operational amplifier;
    a current mirror circuit including a third transistor, a fourth transistor and a fifth transistor, wherein a first terminal of the third transistor, a first terminal of the fourth transistor and a first terminal of the fifth transistor are coupled to the common voltage, a second terminal of the third transistor is connected to a second terminal of the first transistor and a control terminal of the third transistor, a control terminal of the fourth transistor is connected to the control terminal of the third transistor, a second terminal of the fourth transistor and a control terminal of the fifth transistor, and a second terminal of the fifth transistor is connected to a first terminal of the second transistor; and
    a pre-charge capacitor, wherein a first terminal of the pre-charge capacitor is coupled to a common voltage, and a second terminal of the pre-charge capacitor is connected to the control terminal of the third transistor;
    wherein the first current source supplies a current to the pre-charge capacitor to charge the pre-charge capacitor such that a voltage of the pre-charge capacitor increases to a target voltage value, the current is stored in the control terminal of the third transistor, then the light passes through the photodiode, the current is discharged from the third transistor through the first current source to a ground, and a current flowing through a second terminal of the second transistor is a current sensed by the sensor.

2. The sensor according to claim 1, further comprising:
    a second current source, wherein a first terminal of the second current source is connected to the second terminal of the second transistor, and a second terminal of the second current source is grounded.

3. The sensor according to claim 2, further comprising:
a second switch component, wherein a first terminal of the second switch component is connected to the second terminal of the first transistor and the second terminal of the first switch component, and a second terminal of the second switch component is connected to the second terminal of the fourth transistor.

4. The sensor according to claim 1, further comprising:
a first switch component, wherein a first terminal of the first switch component is connected to the control terminal of the third transistor, and a second terminal of the first switch component is connected to the second terminal of the first transistor and the control terminal of the fourth transistor.

5. The sensor according to claim 1, further comprising:
a first capacitor, wherein a first terminal of the first capacitor is connected to the output terminal of the first operational amplifier, and a second terminal of the first capacitor is connected to the cathode of the photodiode.

\* \* \* \* \*